United States Patent
Dellis et al.

(10) Patent No.: US 8,409,963 B2
(45) Date of Patent: Apr. 2, 2013

(54) METHODS OF EMBEDDING THIN-FILM CAPACITORS INTO SEMICONDUCTOR PACKAGES USING TEMPORARY CARRIER LAYERS

(75) Inventors: Lynne E. Dellis, Willow Spring, NC (US); Karl Hartmann Dietz, Raleigh, NC (US); David Ross McGregor, Apex, NC (US)

(73) Assignee: CDA Procesing Limited Liability Company, Wilmington, DE (US)

( * ) Notice: Subject to any disclaimer, the term of this patent is extended or adjusted under 35 U.S.C. 154(b) by 179 days.

(21) Appl. No.: 12/763,412

(22) Filed: Apr. 20, 2010

(65) Prior Publication Data
US 2010/0270644 A1 Oct. 28, 2010

Related U.S. Application Data

(60) Provisional application No. 61/173,348, filed on Apr. 28, 2009.

(51) Int. Cl.
*H01L 51/05* (2006.01)
*H01L 29/92* (2006.01)

(52) U.S. Cl. ............... 438/396; 257/532; 257/E21.499; 257/E27.048; 438/3; 438/381; 438/464; 438/654; 438/106; 361/763; 361/766

(58) Field of Classification Search .............. 257/532, 257/E21.499, E27.048; 438/3, 381, 396, 438/464, 654, 106; 361/763, 766
See application file for complete search history.

(56) References Cited

U.S. PATENT DOCUMENTS

| | | | |
|---|---|---|---|
| 3,783,499 A * | 1/1974 | Hughes et al. | 438/3 |
| 4,509,096 A * | 4/1985 | Baldwin et al. | 361/719 |
| 6,256,850 B1 | 7/2001 | Lauffer et al. | |
| 6,541,137 B1 | 4/2003 | Kingon et al. | |
| 6,611,419 B1 | 8/2003 | Chakravorty | |
| 6,649,930 B2 | 11/2003 | Farrell | |
| 6,839,219 B2 | 1/2005 | Mashiko et al. | |
| 6,841,080 B2 | 1/2005 | Kingon et al. | |
| 7,029,971 B2 | 4/2006 | Borland et al. | |
| 7,150,767 B1 | 12/2006 | Schneider et al. | |
| 7,190,016 B2 | 3/2007 | Cahalen et al. | |
| 7,612,438 B2 * | 11/2009 | Akiyama et al. | 257/676 |
| 7,829,985 B2 * | 11/2010 | Lee et al. | 257/666 |
| 8,003,496 B2 * | 8/2011 | Oh et al. | 438/464 |
| 2004/0262537 A1 | 12/2004 | Leblans | |
| 2005/0001185 A1 | 1/2005 | Everingham et al. | |

(Continued)

FOREIGN PATENT DOCUMENTS

EP 1909546 A1 4/2008

OTHER PUBLICATIONS

U.S. Appl. No. 12/431,298, filed Apr. 28, 2009.

(Continued)

*Primary Examiner* — Matthew Reames
*Assistant Examiner* — Benjamin Tzu-Hung Liu

(57) ABSTRACT

Disclosed are methods of making a semiconductor package comprising at least one thin-film capacitor embedded into at least one build-up layer of said semiconductor package. A thin-film capacitor is provided wherein the thin-film capacitor has a first electrode and a second electrode separated by a dielectric. A temporary carrier layer is applied to the first electrode and the second electrode is patterned. A PWB core and a build-up material are provided, and the build-up material is placed between the PWB core and the patterned second electrode of said thin-film capacitor. The patterned electrode side of the thin-film capacitor is laminated to the PWB core by way of the build-up material, the temporary carrier layer is removed, and the first electrode is patterned.

16 Claims, 15 Drawing Sheets

U.S. PATENT DOCUMENTS

| | | |
|---|---|---|
| 2005/0088833 A1 | 4/2005 | Kikuchi et al. |
| 2006/0138591 A1 | 6/2006 | Amey, Jr. et al. |
| 2006/0180342 A1* | 8/2006 | Takaya et al. ......... 174/256 |
| 2006/0281278 A1 | 12/2006 | Min |
| 2007/0049026 A1 | 3/2007 | Miyamoto et al. |
| 2007/0132088 A1 | 6/2007 | Kariya et al. |
| 2007/0134910 A1* | 6/2007 | Kariya et al. ......... 438/622 |
| 2008/0216298 A1 | 9/2008 | Dudnikov |
| 2008/0236877 A1 | 10/2008 | Amey, Jr. et al. |
| 2008/0316723 A1 | 12/2008 | Borland et al. |
| 2009/0035913 A1 | 2/2009 | Bao et al. |
| 2009/0290316 A1 | 11/2009 | Kariya |

OTHER PUBLICATIONS

U.S. Appl. No. 12/763,444, filed Apr. 20, 2010.
U.S. Appl. No. 12/763,433, filed Apr. 20, 2010.
International Preliminary Report on Patentability for PCT/US2010/032694 and issued Nov. 1, 2011.
International Search Report and Written Opinion for PCT/US2010/032694 and mailed Jul. 6, 2010.

* cited by examiner

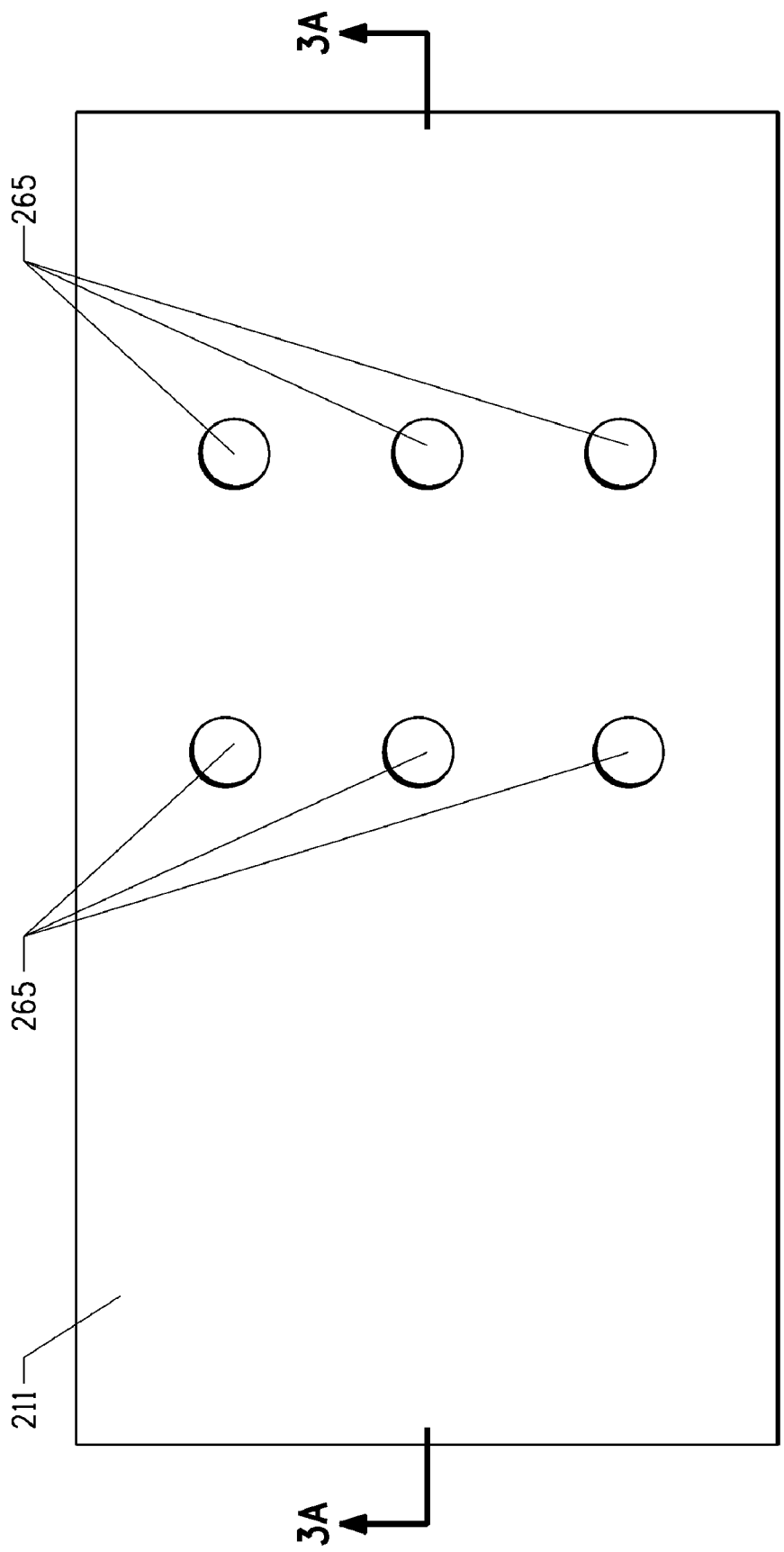

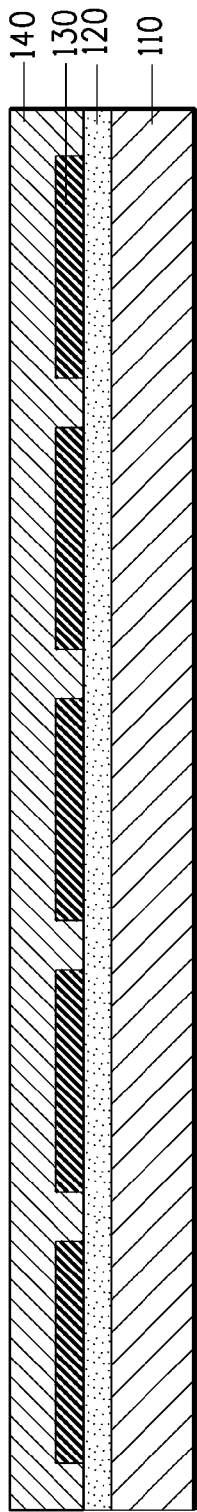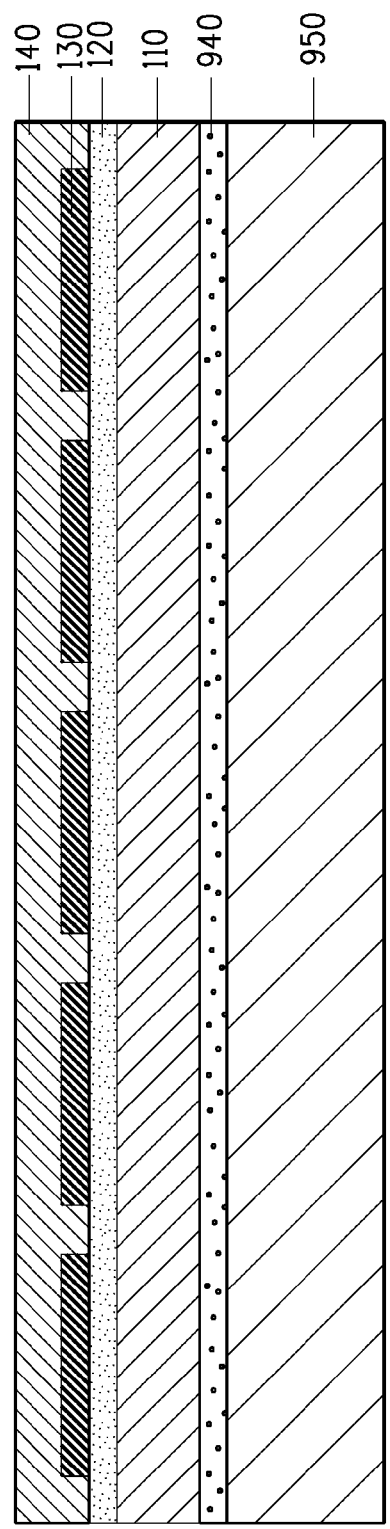
FIG. 9A
FIG. 9B

METHODS OF EMBEDDING THIN-FILM CAPACITORS INTO SEMICONDUCTOR PACKAGES USING TEMPORARY CARRIER LAYERS

Priority is claimed to U.S. Provisional Application No. 61/173,348 filed on Apr. 28, 2009, which is herein incorporated by reference.

TECHNICAL FIELD

The technical field relates to semiconductor packages and methods of incorporating thin-film capacitors into the build-up layers of a semiconductor package to provide low inductance power to the semiconductor device.

BACKGROUND ART

As semiconductor devices including integrated circuits (IC) operate at higher frequencies, higher data rates and lower voltages, noise in the power and ground (return) lines and supplying sufficient current to accommodate faster circuit switching become increasingly important problems requiring low impedance in the power distribution system. In order to provide low noise, stable power to the IC, impedance in conventional circuits is reduced by use of large numbers of surface mount technology (SMT) capacitors interconnected in parallel placed and as close to the IC as possible.

High power and high frequency ICs are generally mounted on a semiconductor package. The semiconductor package is generally only somewhat larger than the IC or ICs. The semiconductor package, complete with mounted ICs, is conventionally mounted to a larger printed wiring mother board or daughter card.

As frequencies increase and operating voltages continue to drop, increased power must be supplied at faster rates requiring increasingly lower inductance and impedance levels. There is, however, a limitation to the number of SMT chip capacitors that can be mounted in parallel on a semiconductor package because the package is not much larger than the IC itself.

Considerable effort has, therefore, been expended to minimize impedance. One method of minimizing impedance is to embed the capacitor function into the semiconductor package to reduce the distance from the capacitor to the IC. This reduces the inductance and hence the impedance.

U.S. Patent Application Publication No. 2008-0316723A1 to Borland et al., discloses methods of incorporating thin-film capacitors into the build-up layers of a printed wiring board (PWB) such as a semiconductor package, and suggests that a carrier film may be applied to the thin-film capacitor structure to provide additional support during printed wiring board processing. However, Borland et al. does not disclose methods or specific materials that may be utilized.

There is a need for novel methods and materials for carrier layers that provide structural support and improve the process of incorporating a thin-film capacitor into the build-up layers of a semiconductor package.

SUMMARY

Disclosed herein are methods of making a semiconductor package comprising at least one thin-film capacitor embedded into at least one build-up layer of said semiconductor package. According to the disclosed method a thin-film capacitor is provided wherein the thin-film capacitor has a first electrode and a second electrode separated by a dielectric. A temporary carrier layer is applied to the first electrode and the second electrode is patterned. A PWB core and a build-up material are provided, and the build-up material is placed between the PWB core and the patterned second electrode of said thin-film capacitor. The patterned electrode side of the thin-film capacitor is laminated to the PWB core by way of the build-up material, the temporary carrier layer is removed, and the first electrode is patterned.

In a disclosed embodiment, the first electrode is a magnetic metal and the temporary carrier layer is a magnetic carrier layer. In another disclosed embodiment, the temporary carrier layer is rigid substrate that is applied to first electrode using an adhesive. In another embodiment, the temporary carrier layer is a copper clad that is applied to first electrode using an adhesive. In yet another disclosed embodiment, a temporary tape carrier is attached to one electrode of the thin-film capacitor.

Semiconductor packages constructed according to the above methods allow for improved structural support during printed wiring board processing which provides for minimal distortion or buckling of the thin-film capacitor.

Those skilled in the art will appreciate the above stated advantages and other benefits of various additional embodiments and aspects of this disclosure upon reading the following detailed description.

According to common practice, the various features of the drawings are not necessarily drawn to scale. Dimensions of various features may be expanded or reduced to more clearly illustrate the embodiments of the invention.

BRIEF DESCRIPTION OF THE DRAWINGS

FIG. 1C is a section view of the thin-film fired-on-foil capacitor taken along the line 1C-1C of the plan view of FIG. 1D.

FIGS. 3A-3B illustrate patterning the second electrode to create antipads within the footprint of a known, good capacitor electrode. FIG. 3A is a section view of the thin-film fired-on-foil capacitor with patterned second electrode taken along the line 3A-3A of the plan view of FIG. 3B.

FIG. 6A is a section view taken along the line 6A-6A of the plan view of FIG. 6B.

FIGS. 9A-9B illustrate a view in cross-section of the attachment of a tape carrier layer using an adhesive to the metal foil side of the thin-film capacitor.

DETAILED DESCRIPTION

Figure 1A:
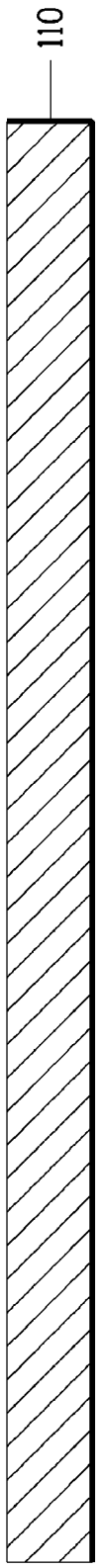
FIGS. 1A-1F illustrate the fabrication of a thin-film capacitor foil structure 100.

The detailed description discusses the inventions recited in the claims with reference to the following defined terms:

As used herein, the term "thin-film capacitor" refers to a capacitor wherein the dielectric comprises a high dielectric constant material and the dielectric thickness in between approximately 0.2 and 2.0 micrometers.

As used herein, the term "fired-on-foil thin-film capacitors" refers to capacitors that are formed by: (1) firing at an elevated temperature a dielectric layer deposited onto a metallic foil in order to crystallize and sinter the dielectric, which forms a high dielectric constant thin-film; and (2) depositing a top electrode on the dielectric.

As used herein, the term "embedding" refers to placing, positioning or integrating the capacitors within the build-up layers of a semiconductor package.

As used herein, the term "high dielectric constant" or "high K, capacitor dielectric materials" refers to materials that have a bulk dielectric constant above 500.

As used herein, the term "semi additive process" (SAP) refers to the method of forming electrical traces by pattern plating using resist followed by etching a seed layer that does not get plated up during the SAP process.

As used herein, the term "build-up material" refers to any of a number of organic dielectric materials common to the printed wiring board industry that are in a B-stage or not fully cured state that can be used as build-up layer to cover and encapsulate a conductive layer, act as a dielectric separation between conductive metal layers, and bond two conductive layers together. During or after covering, encapsulating, separating or bonding, the build-up material is cured by heat and or pressure. The build-up material is typically comprised of an epoxy resin. An example of a build-up material used in the printed wiring board industry is ABF GX-13 available from Ajinomoto Fine-Techno Co., Inc. Build-up material is a generic term and can include any reinforced or non-reinforced B-stage resin system used in the printed wiring board industry.

As used herein, the term "core", "PWB core", "epoxy glass core", or "PWB laminated core" refers to printed wiring board structure that is formed in one lamination step from a number of inner layer PWB panels. The term is used generically to indicate the starting point or a base for additional metal/dielectric layers that are built up or sequentially added to the core to form a semiconductor package.

As used herein, the term "copper clad" comprises an epoxy glass layer. The epoxy glass layer generally has a copper foil laminated to one side but it could have two layers and two or more epoxy glass layers may be used.

As used herein, the term "plurality" means more than one.

As used herein, the term "known, good capacitor" refers to a capacitor that has been tested and is known to be functioning within predetermined specifications.

As used herein, the term "singulated capacitor" refers to one of the plurality of capacitors formed from dividing a single, known good, fired-on-foil capacitor. The single, fired-on foil-capacitor has been previously tested and determined as known good. Any singulated capacitor may or not have one or both (top or bottom) electrodes common with other singulated capacitors made from the same, large fired-on-foil capacitor.

As used herein, a common electrode refers to a continuous capacitor electrode that functions as 2 or more electrodes for 2 or more singulated capacitors.

As used herein "carrier layer" and "carrier film" are interchangeable.

As used herein, "lamination" refers to the process of using temperature and pressure to attach two layers together. Lamination parameters will vary based on material selection.

As used herein, the term "semiconductor package" refers to a printed wiring board [PWB] that is small in area, interposer, multichip module, area array package, system-on package, system-in-package, and the like, or a device used as such.

Disclosed herein are methods of making a semiconductor package comprising at least one thin-film capacitor embedded into at least one build-up layer of the semiconductor package. The at least one thin-film capacitor has a first electrode and a second electrode, and a temporary carrier layer is attached to one electrode for structural support during printed wiring board processing.

In one embodiment of the disclosed methods, the thin-film capacitor has a first electrode comprising a metal that is attracted by a magnet, and a temporary carrier layer comprising a magnetic sheet is attached to the thin-film capacitor electrode comprising the magnetic metal.

In another embodiment the temporary carrier layer comprising a magnetic sheet is attached to the thin-film capacitor second electrode.

In another embodiment of the disclosed methods, a copper clad that comprises an epoxy glass layer is temporarily attached to one electrode of the thin-film capacitor.

In yet another embodiment of the disclosed methods, a temporary tape carrier is attached to one electrode of the thin-film capacitor.

Semiconductor packages constructed according to the above methods allow for improved structural support during printed wiring board processing which provides for minimal distortion or buckling of the thin-film capacitor.

According to the disclosed methods, a temporary carrier layer is attached to either the first or second electrode of the thin-film capacitor to provide structural support so that the thin-film capacitor structure can be processed using standard PWB methods without distortion or buckling until it is laminated to a core at which point the carrier layer is not necessary and can be removed.

The first embodiment described herein uses a temporary magnetic carrier layer which is attached to either the first or second electrode side of the thin-film capacitor foil to provide the structural support to withstand processing through PWB equipment lines without distortion or buckling of the thin-film capacitor structure.

In FIG. 1A a metallic foil 110 is provided. Foil 110 will become the first electrode of the thin-film capacitor foil. Foil 110 is comprised of a metal that is attracted by a magnet (i.e., a ferromagnetic metal). Foil 110 may comprise iron, cobalt, nickel, alloys thereof, or combinations thereof. Foil 110 preferably comprises nickel. The thickness of foil 110 may be in the range of, for example, between 1 and 100 microns, preferably between 3 and 75 microns, and most preferably between 12 and 36 microns. An example of a suitable nickel foil is Nickel foil 270 obtainable from Hamilton Precision Metals of Lancaster, Pa.

Figure 1B:
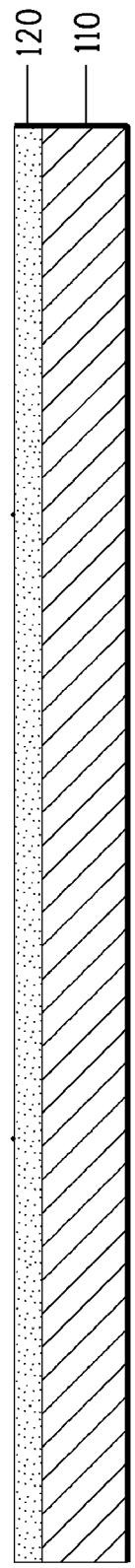

In FIG. 1B, a capacitor dielectric precursor material is deposited onto foil 110 to form capacitor dielectric precursor layer 120. A high capacitance density capacitor can be achieved by use of a precursor for a high K capacitor dielectric material. High dielectric constants are well known in ferroelectric ceramics. Ferroelectric dielectric materials with high dielectric constants include perovskites of the general formula $ABO_3$ in which the A site and B site can be occupied by one or more different metals. For example, high K dielectric material is realized in crystalline barium titanate (BT), lead zirconate titanate (PZT), lead lanthanum zirconate titanate (PLZT), lead magnesium niobate (PMN) and barium strontium titanate (BST). Barium titanate based compositions are particularly useful as they have high dielectric constants and they are lead free.

The capacitor dielectric material may be deposited, for example, by coating the nickel foil with a chemical solution of a suitably high dielectric constant material (i.e., chemical solution deposition or "CSD"). CSD techniques are desirable due to their simplicity and low cost. Other methods of depositing the thin-film dielectric include sputtering, laser ablation, chemical vapor deposition or combinations thereof. The initial deposition composition is either amorphous or crystalline depending upon deposition conditions. Amorphous compositions have low K (approximately 20) and have to be annealed at high temperatures to induce crystallization and produce the desired high K phase. The high K phase in barium titanate based dielectrics can be achieved when grain sizes exceed 0.1 micron and so annealing temperatures as high as 900° C. may be used. A barium titanate CSD composition is disclosed in U.S. Patent Publication No. 2005-001185. The precursor composition consists of barium acetate, titanium isopropoxide, acetylacetone, acetic acid and methanol.

The capacitor dielectric material layer 120 is subjected to drying, burnout and firing steps to densify and crystallize the dielectric precursor layer. A suitable firing temperature is in the range of from about 700° C. to about 1400° C., and is more preferably in the range of from about 800° C. to about 1200° C., and may be approximately 900° C. Firing may be conducted under a protective atmosphere sufficiently low in oxygen to help protect the nickel foil from oxidation. An atmosphere having a partial pressure of oxygen in the range of $10^{-7}$ to $10^{-15}$, and more preferably in the range of $10^{-9}$ to $10^{-12}$, helps to protect the nickel foil against oxidation. A firing temperature of approximately 900° C. in an atmosphere having a partial pressure of oxygen in the range of $10^{-9}$ to $10^{-12}$ has been advantageously used in the firing of capacitors having a barium titanate dielectric on a nickel foil.

Figure 1C:
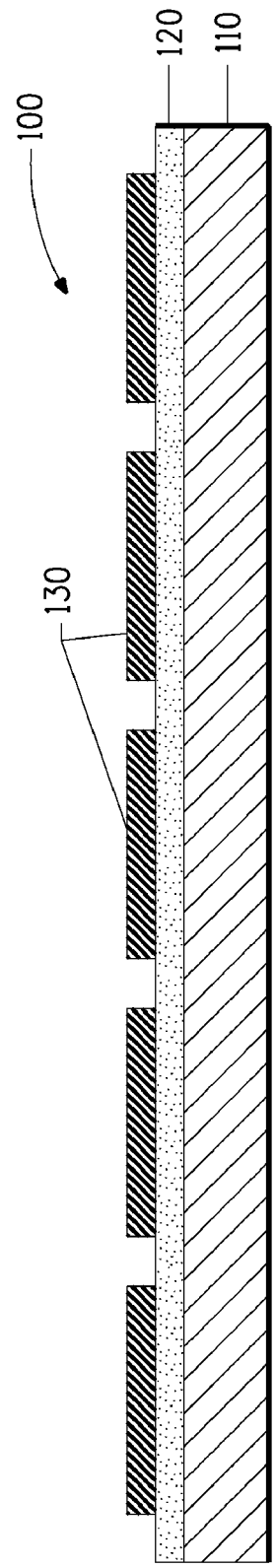

In FIG. 1C, second electrodes 130 are formed over the fired dielectric layer 120 to form capacitors by, for example, sputtering or other known methods. Thickness of second electrode 130 may be between 0.1 micrometer and 15 micrometers but is preferably between approximately 0.5 micrometer and 3 micrometers. The second electrodes 130 are preferably comprised of copper or a copper alloy, and are preferably comprised of at least 60% by weight copper, and more preferably of at least 85% by weight copper.

Figure 1D:
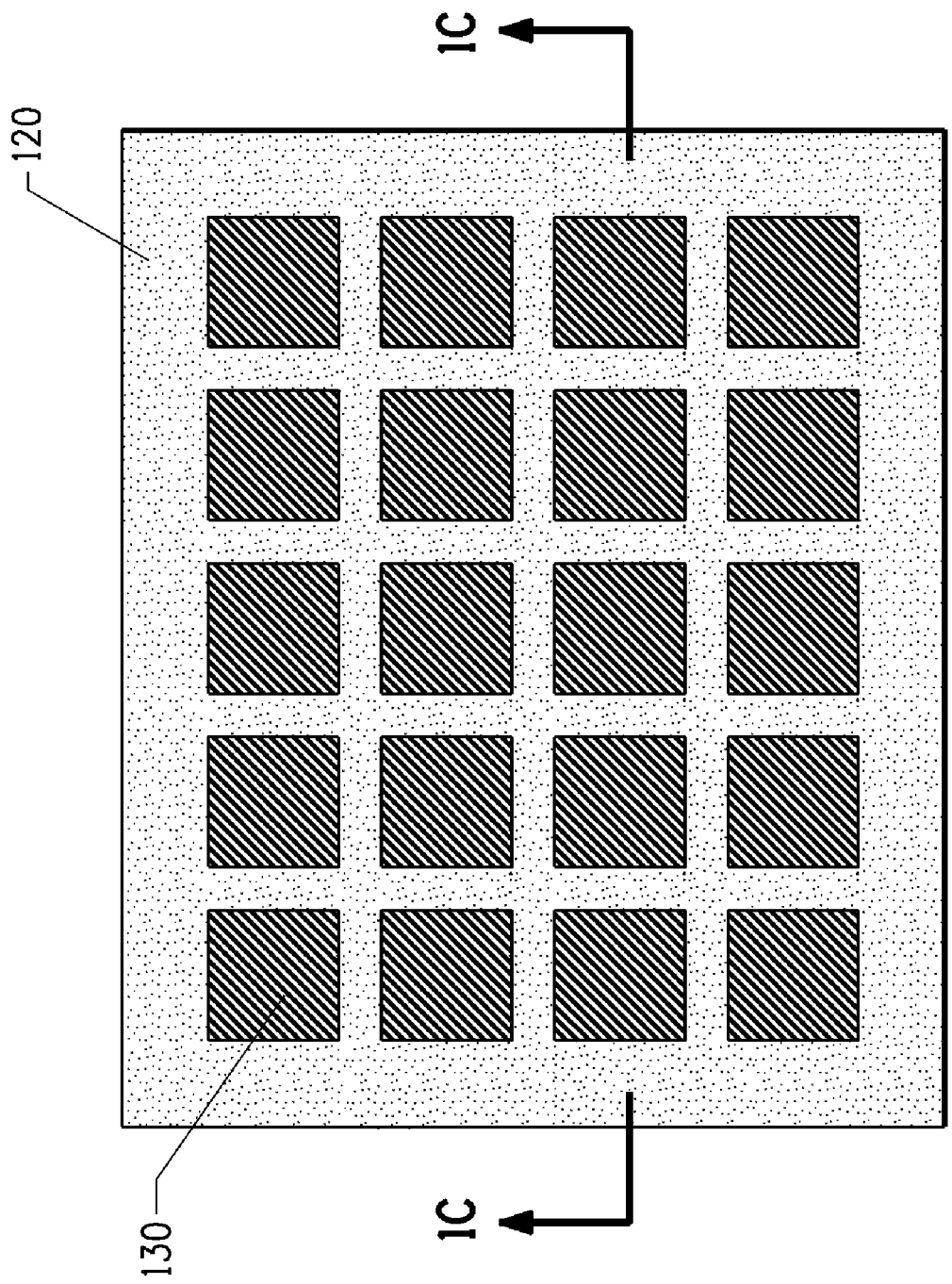

FIG. 1D is a plan view of the fired-on-foil, thin-film capacitors shown in the cross-section of FIG. 1C. The line 1C-1C in FIG. 1D depicts where the cross-section of FIG. 1C is drawn. Twenty capacitors are shown, each having second copper electrode 130 on dielectric layer 120 on nickel foil 110 (the foil is not shown due to 100% dielectric coverage). Foil 110 may be 2"×2" or larger. For example, it may be as large as common PWB foils used in PWB's such as 18"×24". Any number of capacitors, of any size, consistent with the size of foil 110, from one to several hundred, for example, can be formed on foil 110.

Figure 1E:
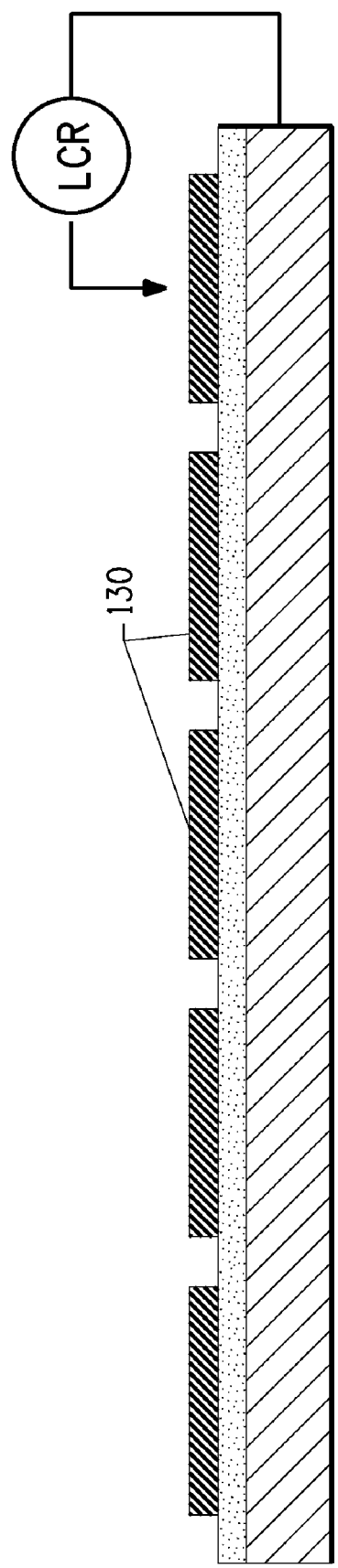

As shown in FIG. 1E, at this stage, the fired-on-foil, capacitors can be tested for capacitance and other properties. Testing identifies the locations of known, good capacitors. If a tested capacitor is shorted or otherwise defective, and its location is known; final assembly into a semiconductor package may be eliminated. If the yield of large capacitors on the foil is low, the foil containing the fired-on-foil capacitors can be discarded. This allows for high yield in the final product.

Figure 1F:
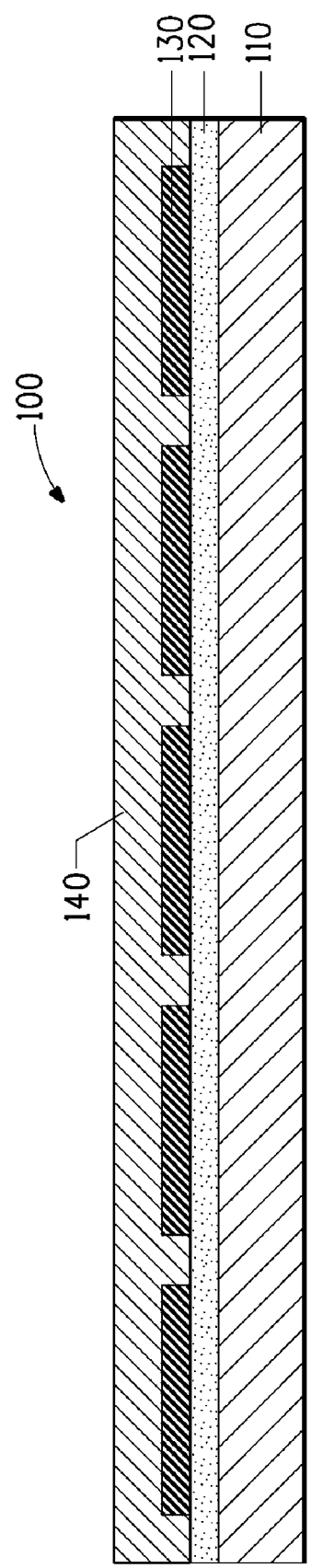

In FIG. 1F, additional copper is added to the copper second electrode 130 side of the thin-film fired-on-foil capacitors to form metal layer 140 and form the thin-film capacitor structure 100. This may be accomplished by sputtering to the desired thickness. Other methods of adding the additional copper to form metal layer 140 may also be practiced. The thickness of metal layer 140 may be between 0.1 and 15 micrometers but is preferable between 0.5 and 3 micrometers.

Figure 2A:
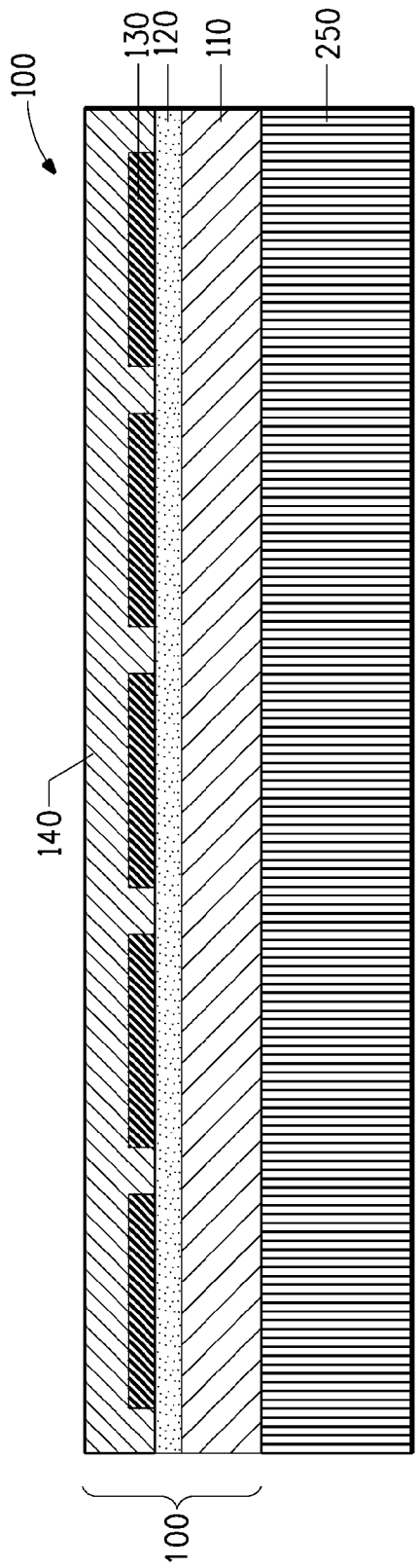
FIGS. 2A-2B illustrate a view in cross-section of the attachment of a magnetic carrier layer to the magnetic metal foil side of the thin-film capacitor foil and the drilling of tooling holes.
Figure 2B:
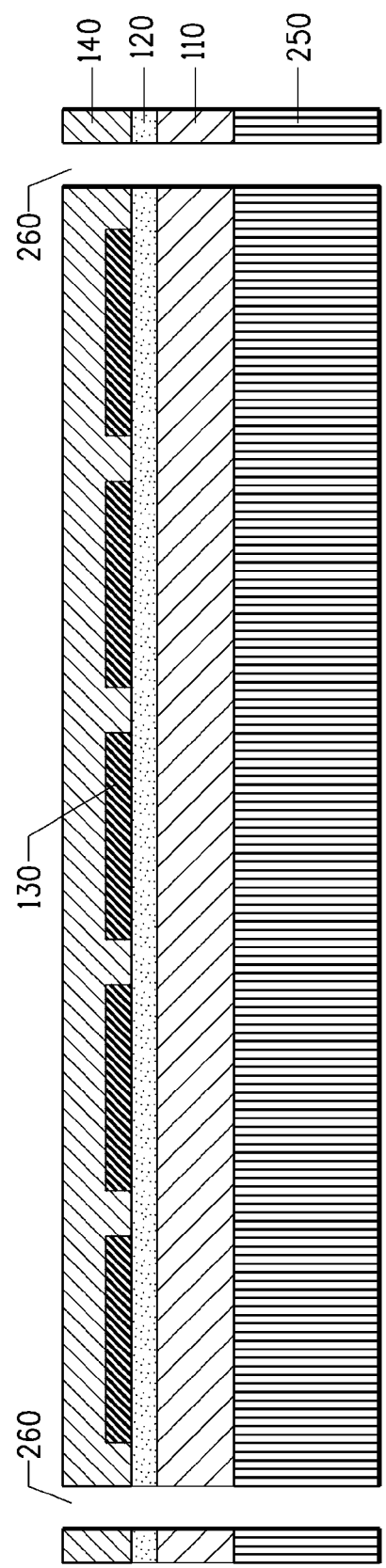

In FIG. 2A magnetic carrier layer 250 is attached to magnetic metal foil 110 of the thin-film capacitor structure 100. Magnetic carrier layer 250 may be a vinyl sheet such as the magnetic vinyl sheets used for refrigerator magnets. Suitable magnetic sheets are 30-mil. thick and 60-mil. thick matte white vinyl magnet sheets available form Magnum Magnetics, of Marietta, Ohio or Rochester Magnet Company, of East Rochester, N.Y. In an alternative embodiment, the magnetic carrier layer 250 may be attached to metal layer 140. When magnetic carrier layer 250 is attached to metal layer 140, the magnetic properties of the underlying magnetic foil 110 are sufficiently strong for the magnetic carrier layer to adhere well to metal layer 140. In such a case, in the following processes, metal foil 110 is patterned first and essentially the processes for metal foil 110 and metal layer 140 are reversed. For illustrative reasons, only the case where magnetic carrier layer 250 is attached to metal foil 110 will be described, In FIG. 2B, tooling holes 260 are formed through the capacitor structure and the magnetic carrier layer 250. Alternatively, it may be feasible to form the tooling holes only through the capacitor structure. Tooling holes 260 may be formed by mechanical or laser drilling. If tooling holes 260 are formed by laser drilling, a protective layer over metal layer 140 may be applied before drilling. The protective layer may be removed after laser drilling. Tooling holes 260 are used for registration purposes in subsequent processing.

Photo-resist is now applied to metal layer 140. The photo-resist applied to metal layer 140 is imaged and developed and metal layer 140 is etched and the remaining photo-resist is stripped. Being protected by the magnetic carrier layer 250, metal foil 110 remains un-etched.

Figure 3A:
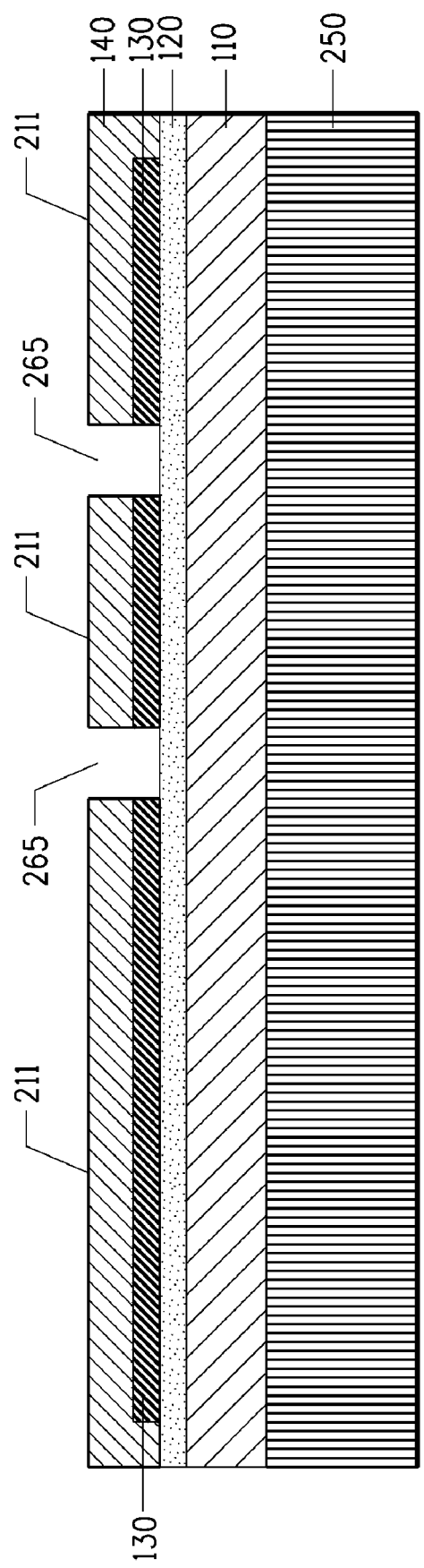

FIG. 3A depicts in cross-section an enlargement of one section of the etched article wherein only one of the electrodes 130 of a known, good capacitor is shown. Etching patterns metal layer 140 and creates common second electrode 211 that will function as multiple ground (second) electrodes of the multiple singulated capacitors. The etching creates antipads (or holes) 265 in second electrode 211 for via connections to the power (first) electrode and to the signal pads. Each known, good capacitor will have the required number of antipads 265 per IC within the footprint (or area) of original second electrode 130. Patterning of the metal layer 140 may also be accomplished by other process flows such as semi-additive processes.

FIG. 3B shows a plan view of the top side of patterned metal layer 211 of FIG. 3A. Shown here are six antipads 265 fabricated within the original footprint of the known, good capacitor second electrode 130. Here, electrode 211 is a common electrode, functioning as three ground electrodes for three singulated capacitors but individual (separated) ground electrodes may also be created.

Figure 4:
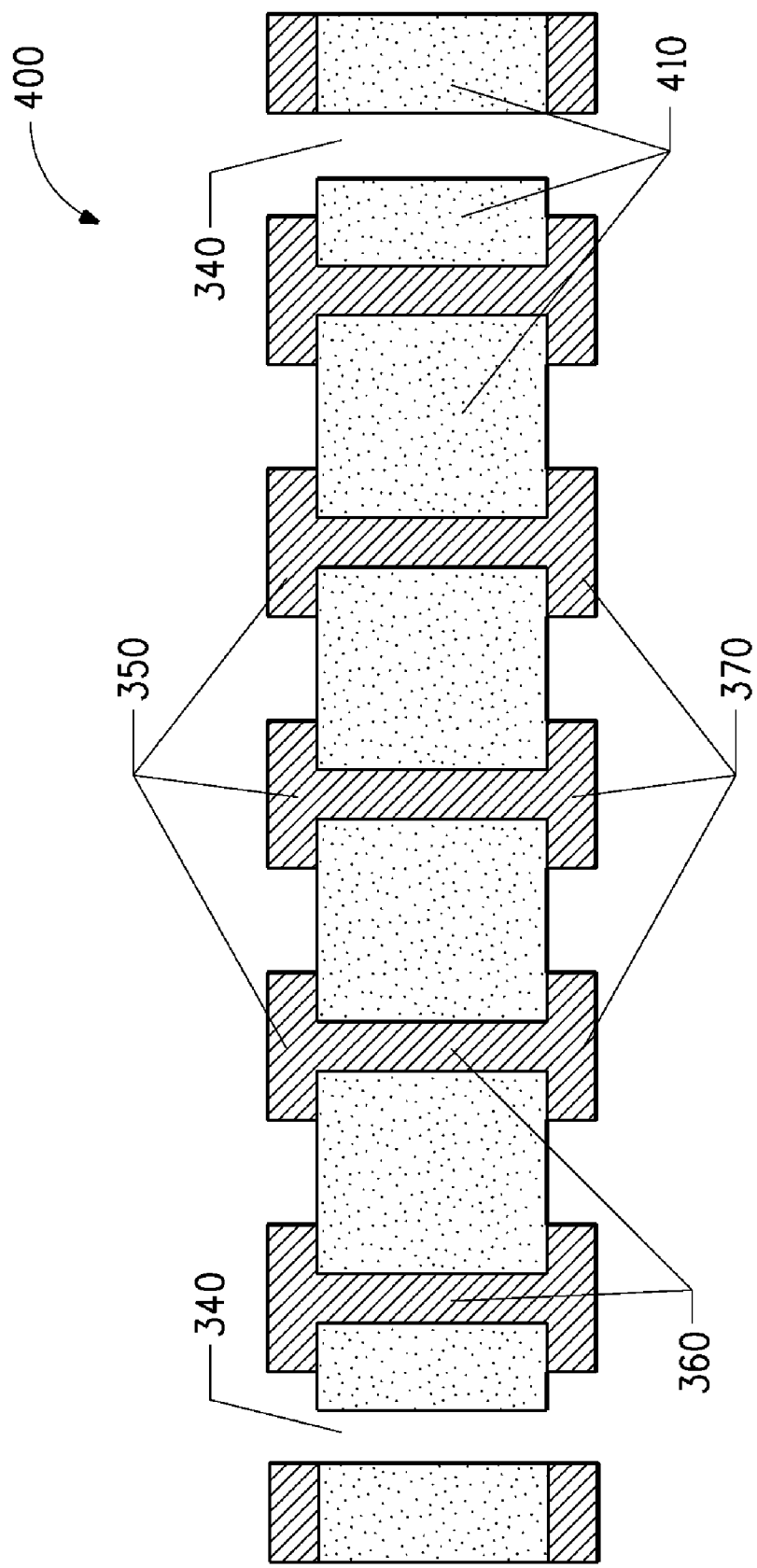
FIG. 4 illustrates a core wherein the copper layer has been patterned to create capture pads and tooling holes have been drilled.

In FIG. 4 a core 400 is provided. The core has a central dielectric 410, tooling holes 340, metal pads 350 and 370 and plated through-holes 360. It may have additional circuitry on the same layer as metal pads 350. Metal pads 350 are at the location where laser drilled via holes are drilled through the build up layers to provide electrical connection from the core metal layer to the build-up metal layers. The pads 350 also prevent the laser from drilling into the core dielectric 410.

Figure 5A:
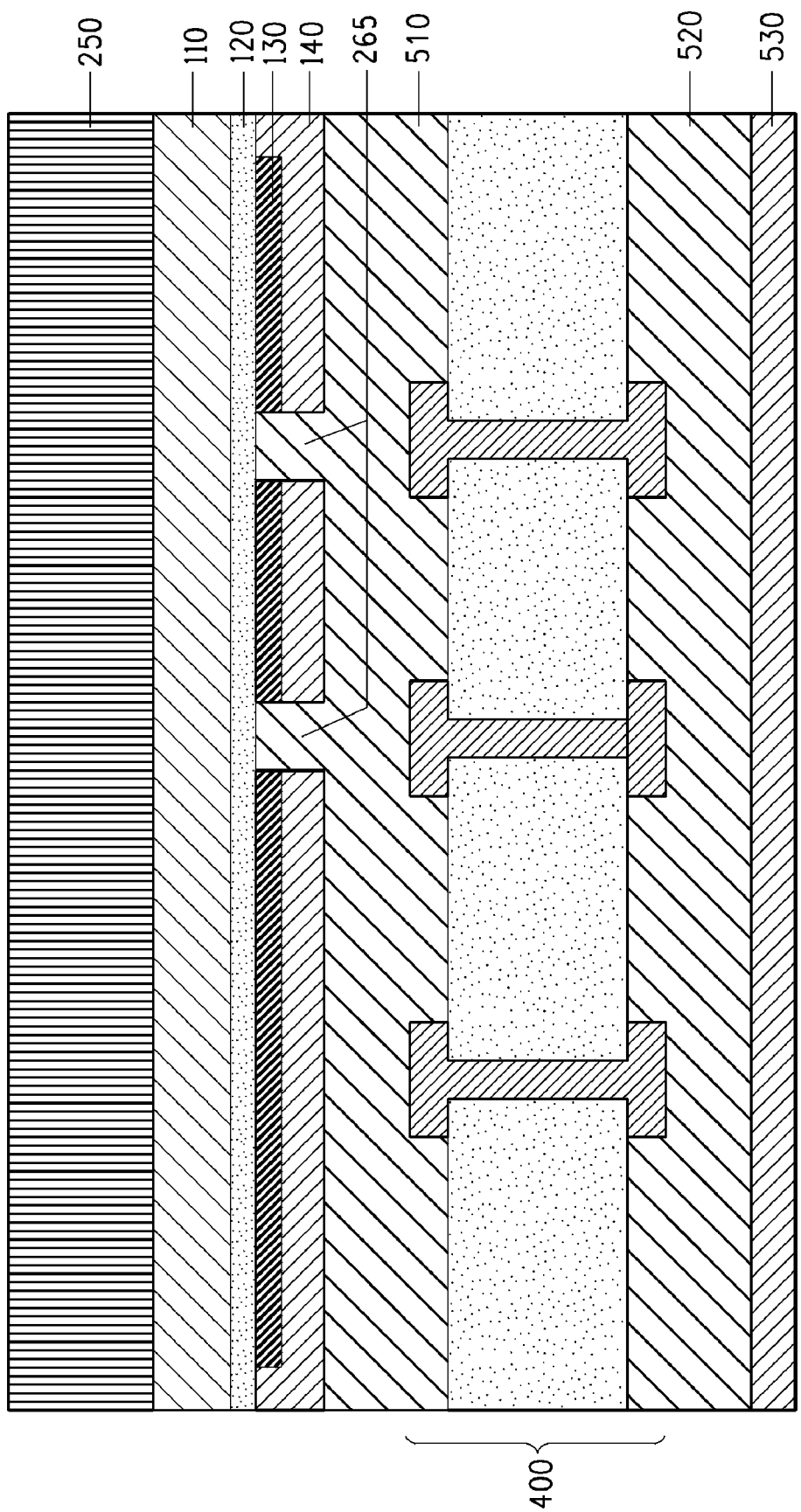
FIGS. 5A-5B illustrate in cross-section view lamination of a core to the patterned side of a thin-film capacitor foil structure.

Referring to FIG. 5A, the article of FIG. 3A is inverted and the side with second common ground electrode 211 with antipads 265 is laminated to core 400 by way of build-up material 510. Dielectric layer 520 and copper foil 530 may also be laminated to the opposite side of the core 400 at the same time. The magnetic carrier layer 250 is now removed to leave the article of FIG. 5B. Magnetic carrier layer 250 may also be removed before the lamination or at an intermediate step in the lamination process.

Figure 5B:
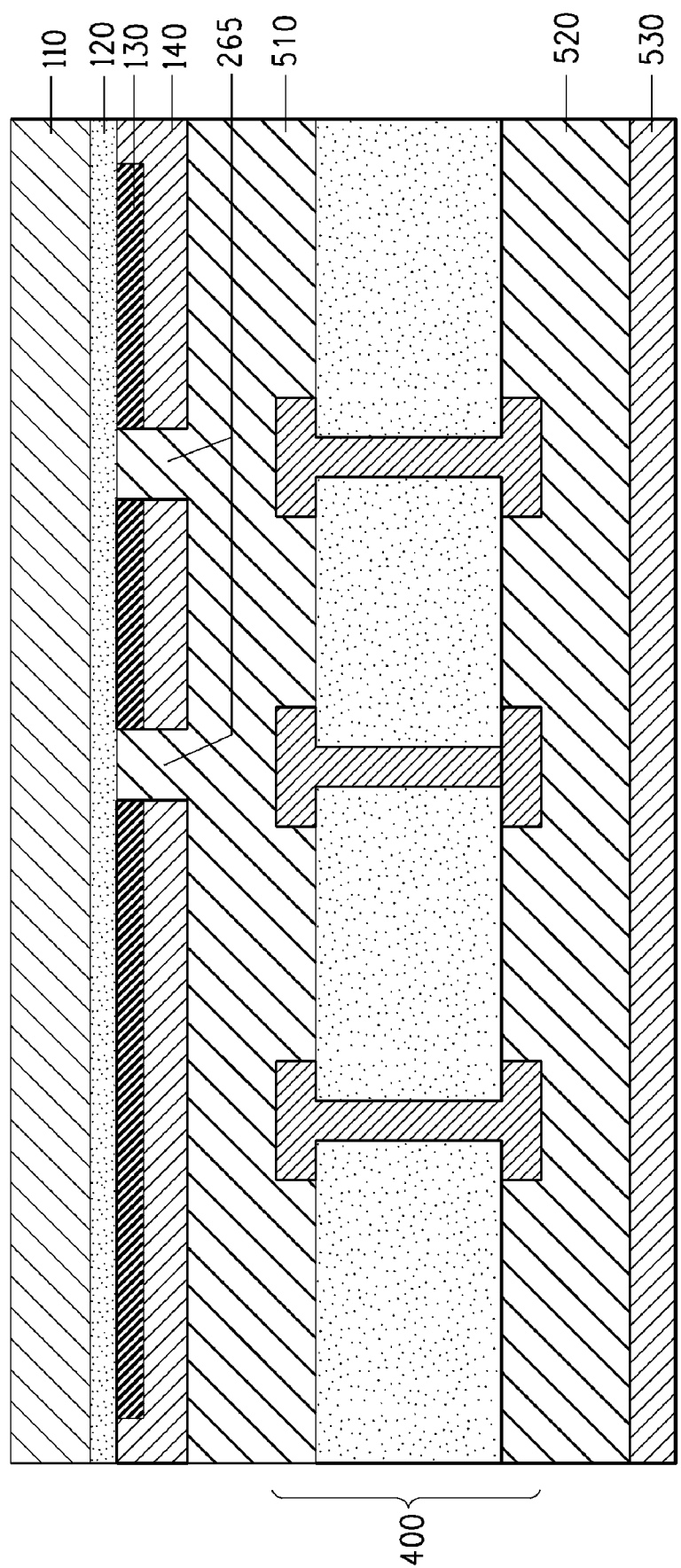
Figure 6A:
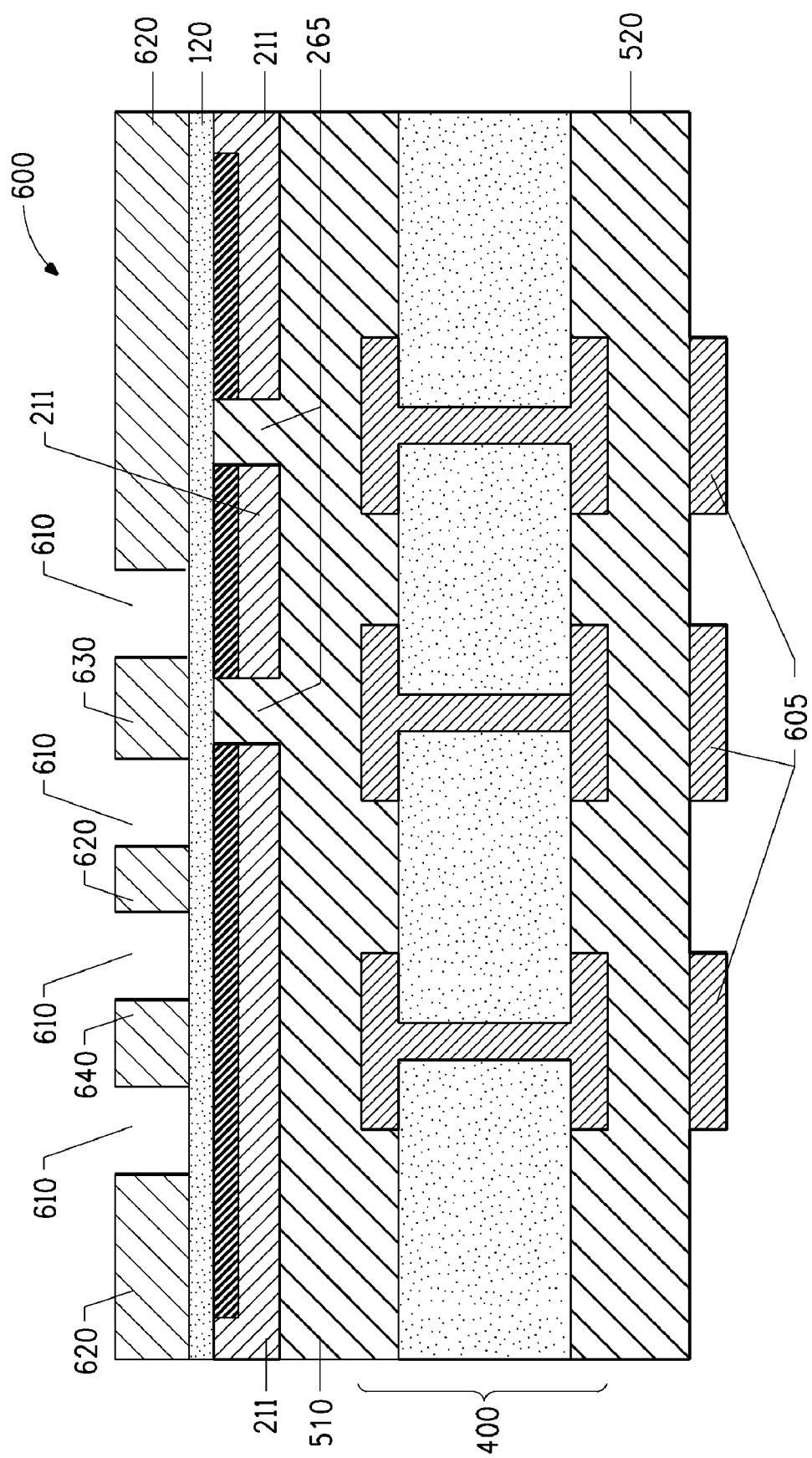
FIGS. 6A-6C illustrate patterning the first electrode and formation of microvias.

Referring to FIG. 5B and FIG. 6A, a photo-resist is now applied to foil 110 and foil 530. The photo-resist is imaged, developed and metal foils 110 and 530 (as shown in FIG. 5B) are etched. The photo-resist is stripped using standard printing wiring board processing conditions to form the article 600 of FIG. 6A. Etching patterns foil 530 to form interconnection pads 605. Etching also patterns foil 110 to form a plurality of circular trenches 610 in the foil. The etching also forms common second electrode 620 that will function as multiple power electrodes of the multiple singulated capacitors. The etching also creates copper pads 630 for signal connection and pads 640 for via connection to the bottom electrode. Features 610, 620, 630 and 640 are within the footprint of original second electrode 130 of the known good, fired-on-foil capacitor, thereby ensuring all singulated capacitors are formed from a known, good capacitor. Patterning foil 110 by etching completes the formation of the plurality of singulated capacitors. Patterning of the foil 110 may also be accomplished by other process flows such as semi-additive processes.

Figure 6B:
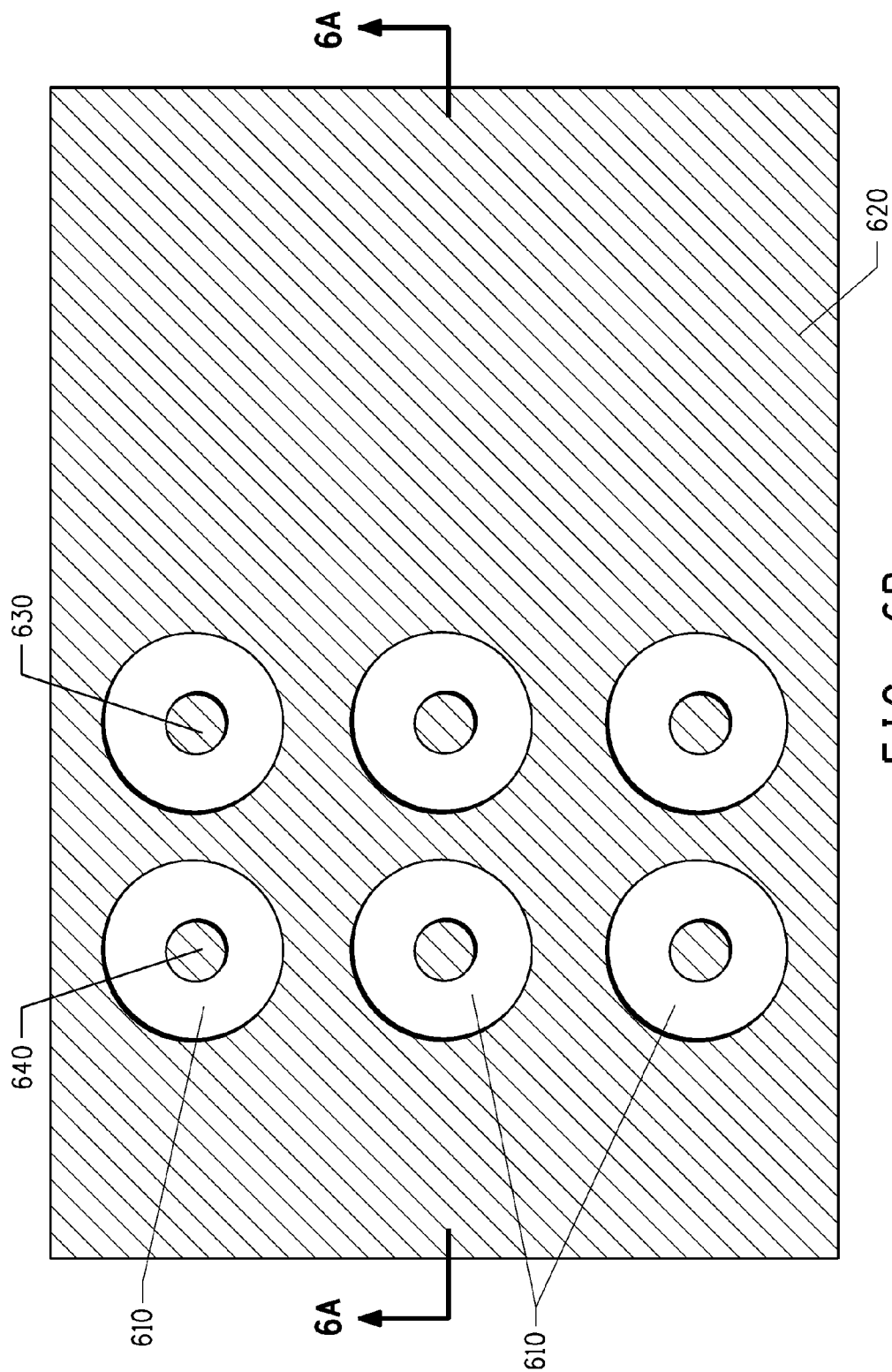

FIG. 6B shows a top plan view of structure 600 having 6 circular trenches matching the design of patterned metal layer 140 shown in FIG. 3B. The number of circular trenches shown here is exemplary and if the IC requires more singulated capacitors than shown, metal layer 140 may be patterned with more antipads, and a matching number of circular trenches may be formed in foil 110 within the footprint of original second electrode 130. Here, electrode 620 is a common electrode functioning as three power electrodes for three singulated capacitors but individual (separated) power electrodes may be patterned from foil 110.

Figure 6C:
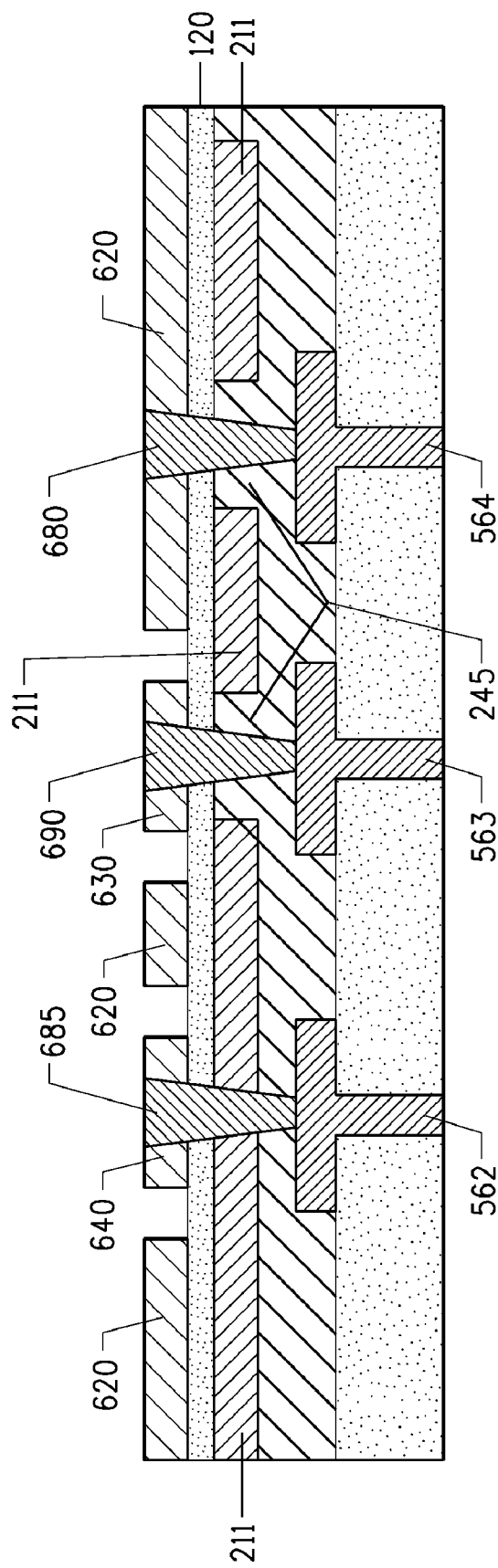

FIG. 6C shows only the top portion of FIG. 6A for clarity. Microvias 680 and 685 are formed and plated to interconnect the top and bottom electrodes respectively to the appropriate through-hole vias 564 and 562 respectively of the laminated core. Microvia 690 is also formed and plated to interconnect the signal pad 630 to the appropriate through-hole 563 of the laminated core. Microvias 680, 685 and 690 can be formed by laser drilling, by photolithography, or by controlled-depth mechanical drilling. Initial metallization of the microvia hole-walls is achieved by depositing a metal seed layer, for example electroless copper. The seed layer deposition may be activated by a catalyst deposited on the microvia surfaces. In one embodiment, palladium is used as the catalyst. The outer circuitry may also be plated with, for example, nickel and gold at this time to finish the article. Alternative process flows may be implemented. For example, the process of forming microvias 680, 685 and 690 may precede patterning the foil 110.

Figure 7:
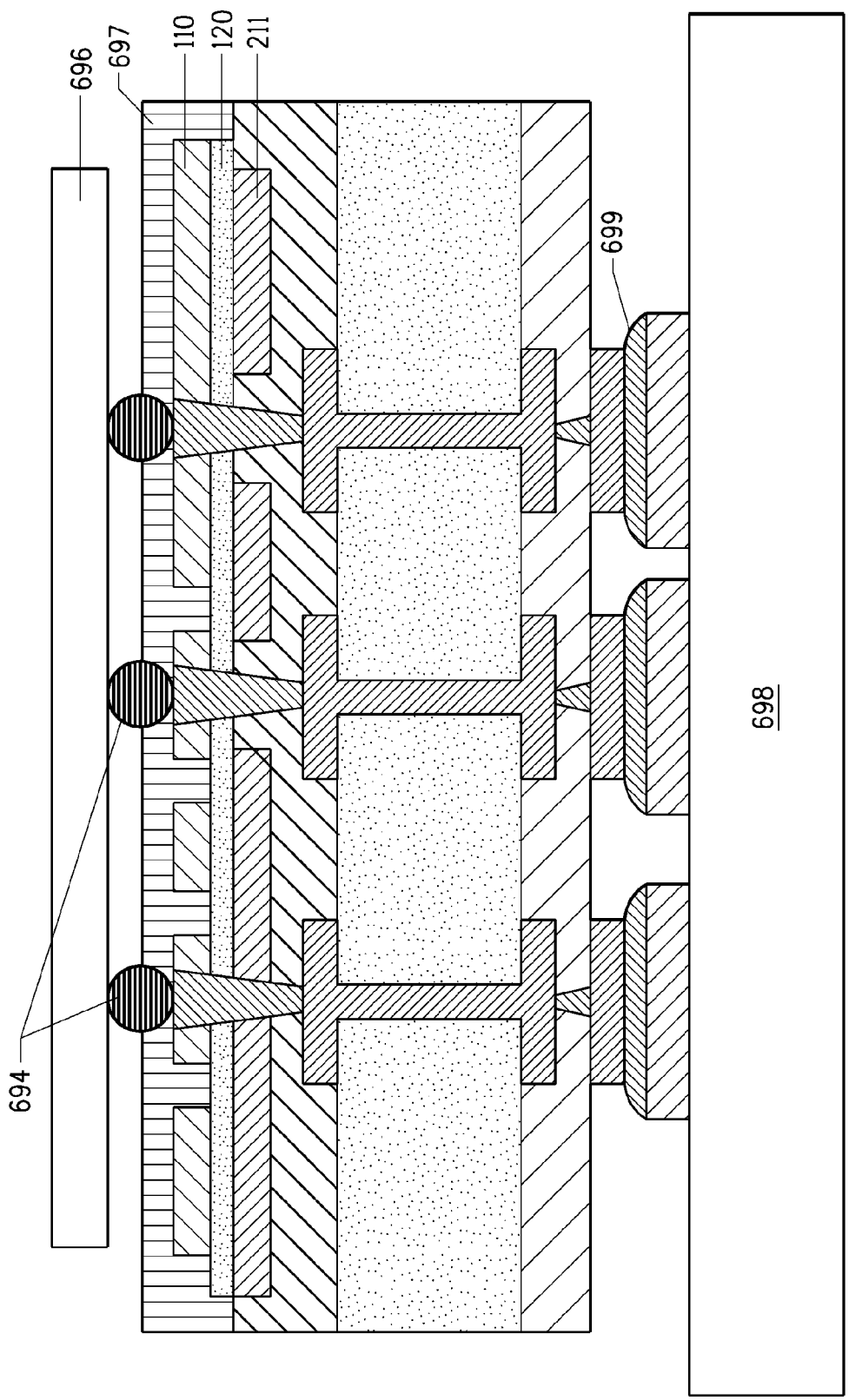
FIG. 7 illustrates a semiconductor device mounted on the semiconductor package which is mounted on a PWB mother board.

The printed circuit boards of FIG. 6C may be connected to the bumps of a flip chip IC and connected to a printed wiring mother board. FIG. 7 illustrates a cross-section of a printed circuit board with a thin-film capacitor embedded into the build up layers that has been connected to a flip chip IC. The printed circuit board of FIG. 6C has been finished with an organic cover coat 697 to protect the outer metal surface of the PWB and define the area of the bumps 694. The printed wiring board is approximately the same size as the IC, thereby having all singulated capacitors within the dimensions or footprint of the IC. A signal terminal of the IC is connected to an isolated pad which is interconnected to the core. The power terminal of the semiconductor is directly connected to an electrode of the singulated capacitor and the ground terminal of the flip chip IC is directly connected to the other electrode. Connection of the bumps 694 of the flip chip IC 696 to the PWB is generally accomplished in a high temperature soldering step. The PWB is then connected to the printed wiring mother board 698 via solder joints 699 in a lower temperature soldering step.

Figure 8A:
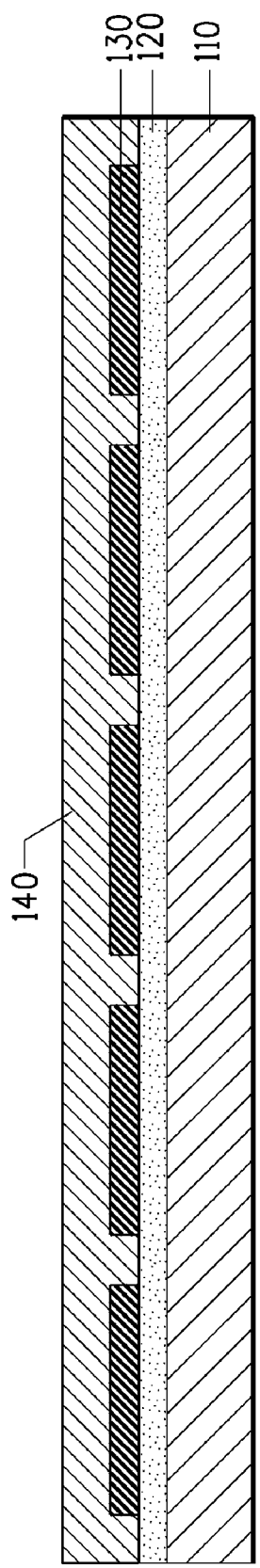
FIGS. 8A-8B illustrate a view in cross-section of the attachment of a copper clad carrier layer using an adhesive to the metal foil side of the thin-film capacitor.
Figure 8B:
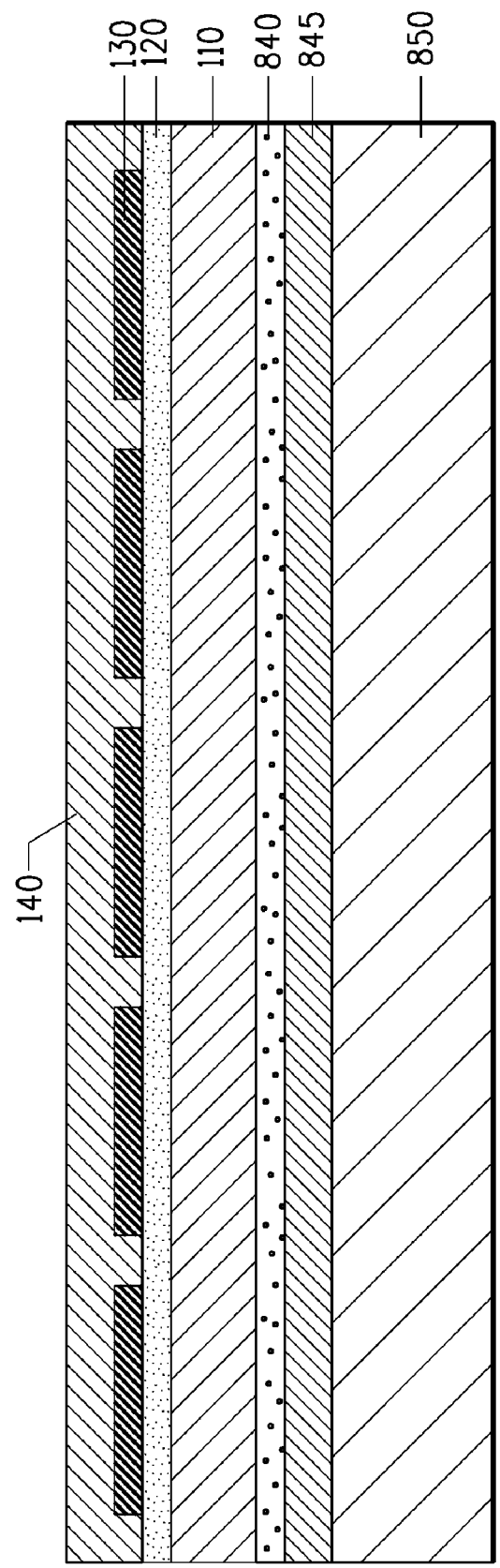

FIGS. 8A and 8B illustrate another embodiment of the disclosed methods. In this case, a copper clad is used as a temporary carrier layer to provide structural support to the thin-film capacitor structure during PWB processing. In FIG. 8A, article 100 of FIG. 1F is provided. In this method, however, an electrode comprising a magnetic metal is not necessary. Referring to FIG. 8B, adhesive layer 840 is first applied to metal layer 110 of the article of FIG. 8A. Adhesive layer 840 is an adhesive that can easily be removed from metal foil 110 later in the processing. A suitable adhesive exhibits low adhesion similar to the releasable adhesive used on removable or releasable tapes or note paper such as Post-it® tapes and note paper sold by 3M of Minneapolis, Minn. Another suitable low adhesion adhesive may be a photoresist material. An example of a suitable photoresist is DuPont Dry Film MX-5020. Other adhesives that are easily removed by other methods may also be used. Also referring to FIG. 8B, a copper clad comprising an epoxy core 850 with copper foil 845 is next attached to the adhesive layer 840. Other process sequences may be practiced. For example, the adhesive may first be applied to copper foil 845 of the copper clad after which the metal foil 110 of the article of FIG. 8A is attached to the adhesive layer 840. In another alternative process, if an adhesive film is utilized, metal foil 110 may be bonded to metal foil 845 by placing the adhesive film between the two surfaces and bringing them together.

The article of FIG. 8B now takes the place of the article of FIG. 2A in the process previously described for the magnetic carrier layer and all subsequent processing is identical. As previously described for the magnetic carrier layer, the copper clad may be removed before the lamination, at an intermediate step in the lamination, or after the lamination to core 400. Also as previously described for the magnetic carrier layer process, the copper clad can be attached to either metal electrode of the thin-film capacitor structure and the process flow adjusted as appropriate.

FIG. 9A and FIG. 9B illustrate yet another embodiment of the disclosed methods. In this case, a tape comprising a film 950 that is coated by an adhesive 940 that has low or temporary adhesion to metal foil 110 may be substituted for the magnetic carrier layer or the copper clad carrier layer previously described. The tape exhibits sufficient structural support to allow the use of standard PWB processing. In this method, an electrode comprising a magnetic metal is again not necessary. An example of a suitable tape is a 5-mil. thick Kapton® polyimide film available from E.I. duPont de Nemours and Company coated with, for example, a silicone adhesive. Silicone coated Kapton® film is available from PPI Adhesive Products Corp., of Broomall, Pa. In FIG. 9A, a tape comprising film 950 and adhesive 940 and the article 100 of FIG. 1F is shown. The tape is bonded to the article of FIG. 1F by light pressure to form the article of FIG. 9B. The article of FIG. 9B now takes the place of the article of FIG. 2A in the process previously described for the magnetic carrier layer and all subsequent processing is identical. As previously described for the magnetic carrier layer, the tape may be removed before the lamination, at an intermediate step in the lamination, or after the lamination to core 400. Also as previously described for the magnetic carrier layer process, the tape can be attached to either metal electrode of the thin-film capacitor structure and the process flow adjusted as appropriate. Other materials may be utilized for temporary carrier layers. For example, any rigid material coated by a suitable adhesive would be suitable. Such materials may include metal, ceramic or plastic, for example.

EXAMPLES

The invention will be further described in the following examples, which do not limit the scope of the invention described in the claims.

Example 1

Three different types of magnetic sheet material were obtained from Magnum Magnetics, of Marietta, Ohio. One was 0.3 mm thick with a biaxially oriented polypropylene material on one of its sides. Another was 0.76 mm thick with a matte white material on one of its sides. A third was a higher magnetic strength material that was 0.76 mm thick with no other material on either side. A piece of each of these 3 types of magnetic sheet was placed in an oven set to a temperature of 190° C. for 30 minutes. Upon removal from the oven, all three magnetic material sheet types were warped and had blisters. A piece of each of the 3 types of magnetic sheet material was placed in an oven set to a temperature of 120° C. for 10 minutes. The 0.3 mm thick magnetic sheet and the 0.76 thick magnetic sheet with the matte white material on one of its sides were unaffected. The higher magnetic strength magnetic sheet sample with no additional material on either side exhibited some minor blisters.

Example 2

Pieces of the three types of magnetic sheets of Example 1 were sequentially exposed to potassium carbonate developer chemistry, cupric chloride etching chemistry and an alkaline, aqueous photoresist stripper chemistry at process temperatures typical in the printed wiring board industry. All of the samples were unaffected.

Example 3

A 25 micrometer thick piece of nickel foil 270, obtained from Hamilton Precision Metals, of Lancaster, Pa., that had been processed through a fired-on-foil thin-film capacitor process without depositing the thin-film dielectric, was placed by hand on a piece of the 0.76 thick magnetic sheet material of Example 1 on the side opposite the white material. DuPont™ Riston® MX-5020 photoresist was laminated to the side of the nickel foil opposite to the magnetic sheet. The photoresist was exposed in an exposure unit typical in the printed wiring board industry to a Stouffer Step 9 exposure level and the coversheet was removed from the exposed photoresist. The sample was laser drilled using a UV laser. The sample was laser drilled with the laser initially impacting the photoresist side of the sample. The photoresist was applied to serve as a temporary means to protect the nickel surface from having any laser drilling residue deposited on the nickel surface. After laser drilling, the photoresist was removed by immersing the sample in aqueous photoresist stripper solution, common in the printed wiring board industry, in a beaker. The sample was then laminated, nickel side down, to an 800 micrometer thick copper clad bismaleimide triazine glass reinforced laminate, available from Isola USA, of Chandler, Ariz., using partially cured epoxy resin ABF GX-13, from Ajinomoto USA Inc., of Fort Lee, N.J., in a lamination press typical in the printed wiring board industry. Lamination conditions were a temperature of 120° C. for 30 minutes. After lamination, the ABF GX-13 resin was cured according to the manufacturer's instructions. After cure, the magnetic sheet was removed from the sample and the nickel surface was examined. The edges of the laser drilled holes were clean and non-deformed. Laser drilling through the photoresist and the magnetic sheet did not impact the quality of the drilled holes in the nickel foil.

The foregoing description of the invention illustrates and describes the present invention. Additionally, the disclosure describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The description is not intended to limit the invention to the form disclosed herein. Also, it is intended that the appended claims be construed to include alternative embodiments, not explicitly defined in the detailed description.

What is claimed is:

1. A method of making a semiconductor package, the method comprising:
   providing a thin-film capacitor, wherein the thin-film capacitor includes a first electrode and a second electrode separated by a dielectric;
   applying a temporary carrier layer to the first electrode after said providing a thin-film capacitor;
   patterning the second electrode;
   providing a printed wiring board (PWB) core and a build-up material, wherein the PWB core includes a first electrically-conductive pad on a first surface, a second electrically-conductive pad on a second surface opposite the first surface, and an electrically-conductive via electrically connecting the first electrically-conductive pad to the second electrically-conductive pad;
   placing the build-up material between the PWB core and the patterned second electrode of the thin-film capacitor;
   laminating the patterned electrode side of the thin-film capacitor to the PWB core by way of the build-up material;
   removing the temporary carrier layer after said laminating; and
   patterning the first electrode.

2. The method of claim 1, wherein the first electrode comprises a ferromagnetic metal and the temporary carrier layer comprises a magnetic carrier layer.

3. The method of claim 2, wherein the temporary carrier layer is maintained adjacent to the first electrode by a magnetic attraction between the temporary carrier layer and the first electrode without assistance from an adhesive material.

4. The method of claim 1, wherein the temporary carrier layer comprises a rigid substrate applied to the first electrode using an adhesive.

5. The method of claim 1, wherein the temporary carrier layer comprises a copper clad applied to the first electrode using an adhesive.

6. The method of claim 5, wherein the copper clad comprises an epoxy glass layer and a copper thin film layer located on the epoxy glass layer.

7. A semiconductor package formed according to the method of claim 1, wherein the semiconductor package comprises:

a thin-film capacitor including a first patterned electrode and a second patterned electrode separated by a dielectric;

a printed wiring board (PWB) core including a first electrically-conductive pad on a first surface, a second electrically-conductive pad on a second surface opposite the first surface, and an electrically-conductive via electrically connecting the first electrically-conductive pad to the second electrically-conductive pad; and a build-up material positioned between the PWB core and the second patterned electrode of the thin-film capacitor, wherein the thin-film capacitor is laminated to the PWB core by way of the build-up material.

8. The semiconductor package of claim 7, wherein the dielectric comprises a ferroelectric ceramic.

9. The semiconductor package of claim 7, wherein the first patterned electrode comprises a ferromagnetic metal.

10. The semiconductor package of claim 7, further comprising an electrically-conductive material formed over the second patterned electrode.

11. The semiconductor package of claim 7, wherein the PWB core further comprises a dielectric material through which the electrically-conductive via is formed and a tooling hole formed through the dielectric material.

12. The semiconductor package of claim 7, further comprising a second electrically-conductive via electrically connecting the first electrically-conductive pad to the first patterned electrode.

13. The method of claim 1, wherein the dielectric comprises a ferroelectric ceramic.

14. The method of claim 1, further comprising forming a layer of electrically-conductive material on the patterned second electrode.

15. The method of claim 14, wherein the layer of electrically-conductive material spans a plurality of patterned electrodes.

16. The method of claim 1, wherein said applying a temporary carrier layer to the first electrode comprises applying a tape to the first electrode after said providing a thin-film capacitor, wherein said removing the temporary carrier layer comprises removing the tape after said laminating, and wherein the tape includes a film layer and an adhesive layer.

* * * * *

UNITED STATES PATENT AND TRADEMARK OFFICE
CERTIFICATE OF CORRECTION

PATENT NO. : 8,409,963 B2
APPLICATION NO. : 12/763412
DATED : April 2, 2013
INVENTOR(S) : Dellis et al.

It is certified that error appears in the above-identified patent and that said Letters Patent is hereby corrected as shown below:

On the title page, item (73), in Column 1, Line 1, delete "Procesing" and insert -- Processing --, therefor.

Signed and Sealed this
Twenty-second Day of October, 2013

Teresa Stanek Rea
*Deputy Director of the United States Patent and Trademark Office*